(12) United States Patent
Watanabe

(10) Patent No.: US 6,760,611 B1
(45) Date of Patent: Jul. 6, 2004

(54) MAGNETIC RESONANCE IMAGING METHOD AND DEVICE THEREFOR

(75) Inventor: Shigeru Watanabe, Moriya-machi (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/018,282

(22) PCT Filed: Apr. 28, 2000

(86) PCT No.: PCT/JP00/02816

§ 371 (c)(1),
(2), (4) Date: Oct. 29, 2001

(87) PCT Pub. No.: WO00/65995

PCT Pub. Date: Nov. 9, 2000

(30) Foreign Application Priority Data

Apr. 30, 1999 (JP) .......................................... 11/124545
Jun. 16, 1999 (JP) .......................................... 11/169400

(51) Int. Cl.[7] .............................................. A61B 5/055
(52) U.S. Cl. ..................... 600/410; 600/420; 324/307; 324/309; 324/308; 382/130
(58) Field of Search ................................. 600/407, 410, 600/413, 420, 419, 431; 324/306, 307, 309, 312, 308; 382/130

(56) References Cited

U.S. PATENT DOCUMENTS 5,031,624 A * 7/1991 Mistretta et al. ............ 600/419
5,713,358 A * 2/1998 Mistretta et al. ............ 600/420
5,830,143 A * 11/1998 Mistretta et al. ............ 600/420
5,881,728 A * 3/1999 Mistretta et al. ............ 600/420
5,928,148 A * 7/1999 Wang et al. ................. 600/420
6,195,579 B1 * 2/2001 Carroll et al. ............... 600/420
6,377,835 B1 * 4/2002 Schoenberg et al. ........ 600/419

FOREIGN PATENT DOCUMENTS

JP 62-268535 11/1987
JP 4-150833 5/1992

* cited by examiner

Primary Examiner—Eleni Mantis Mercader
(74) Attorney, Agent, or Firm—Cooper & Dunham LLP

(57) ABSTRACT

A plurality of time-series NMR signal groups are obtained before and after administration of a contrast agent, on an individual image basis, for the same region of the object. One of the obtained NMR signal group obtained before the administration is defined as standard data, a plurality of subtracted NMR signal groups are produced by performing subtraction between the standard NMR signal group and each of the other NMR signal groups obtained after the administration. The subtracted NMR signal groups are subjected to weighted-addition or cumulative addition to obtain an MR angiographic image excellent in contrast throughout the image, in which processes through which an optimal concentration portion of the contrast agent moves are joined into a single image.

42 Claims, 16 Drawing Sheets

Fig.9
(a)
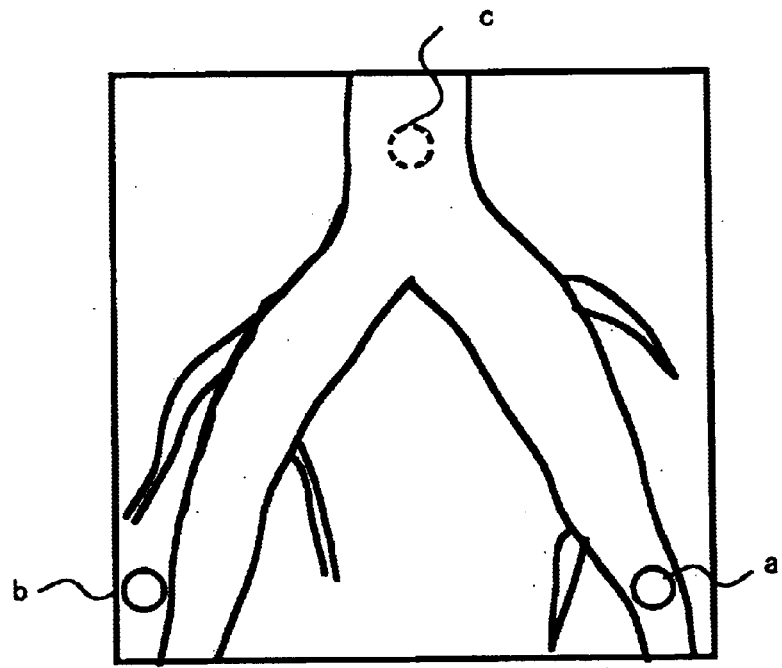
(b)
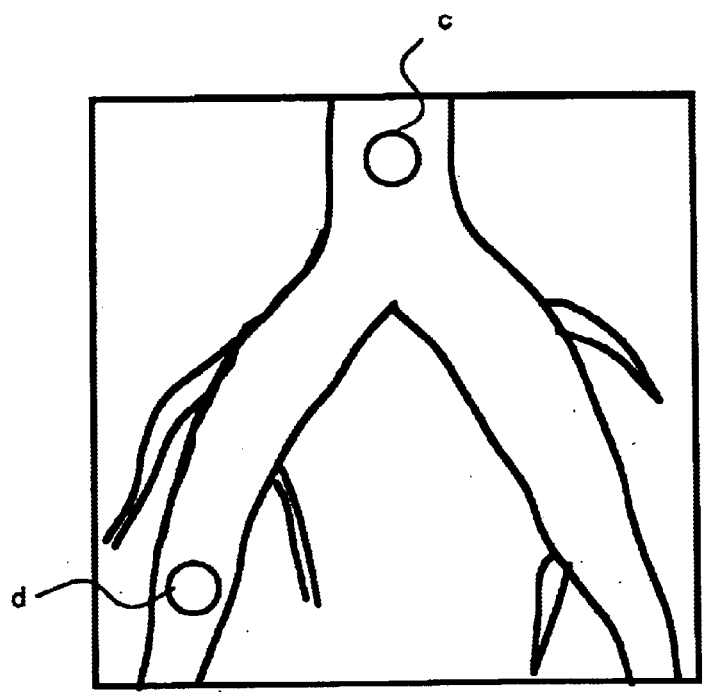

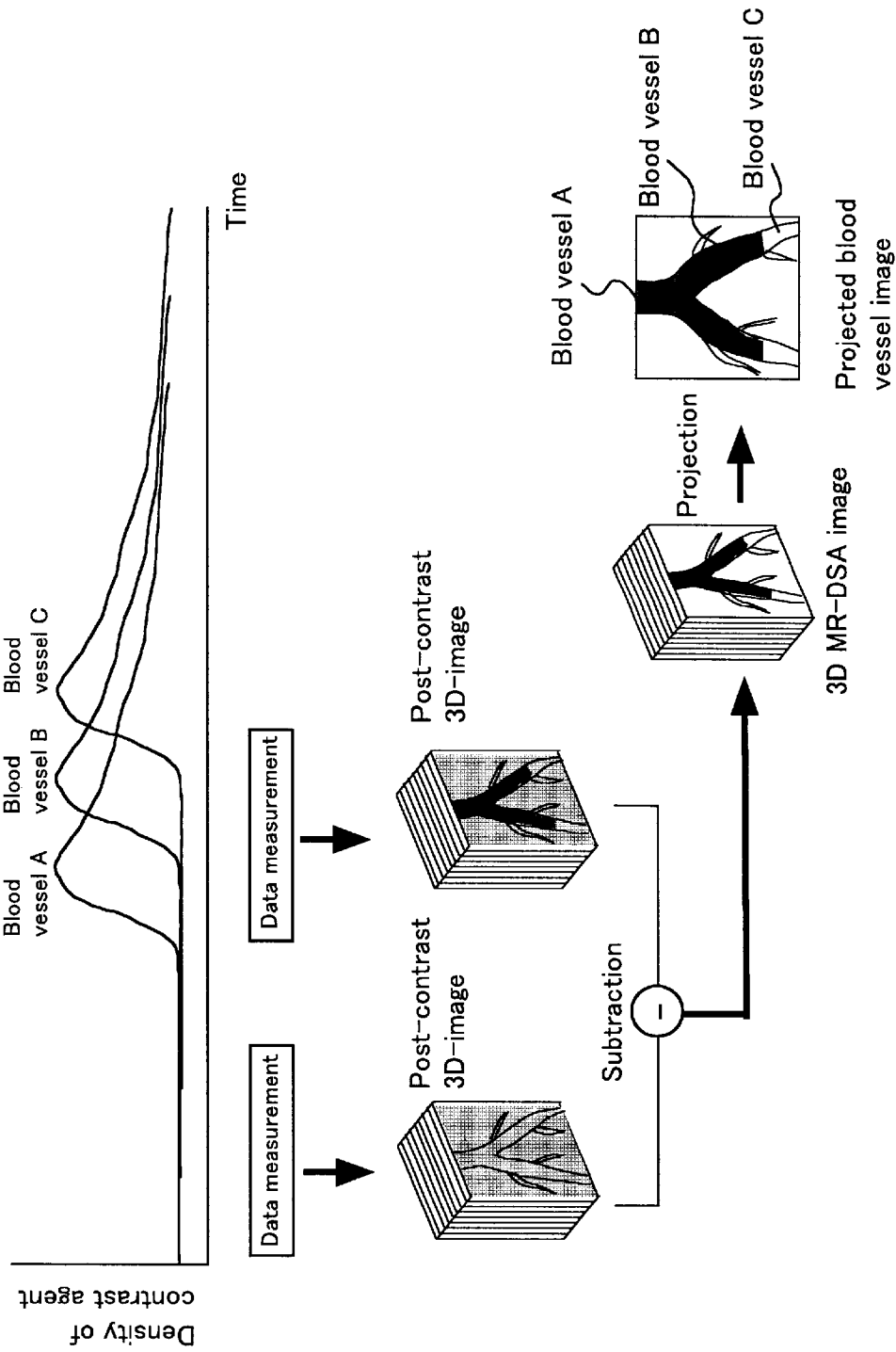

MAGNETIC RESONANCE IMAGING METHOD AND DEVICE THEREFOR

BACKGROUND OF THE INVENTION

The present invention relates to a method and apparatus for magnetic resonance imaging for obtaining tomograms of desired portions of an object to be examined using nuclear magnetic resonance (abbreviated as NMR hereinafter). In particular, it relates to a magnetic resonance imaging method and apparatus capable of obtaining a desired range of images of excellent quality in minimal time to enable visualization of movement in the vascular system.

RELATED ART

A magnetic resonance imaging apparatus (abbreviated as MRI apparatus hereinafter) utilizes NMR to measure density distribution and relaxation time etc. of atomic nuclei in a desired portion of an object to be examined utilizing NMR and, displays images of desired slices of the object produced from the measured data. Conventional MRI apparatuses have a blood flow imaging function called MR angiography (abbreviated as MRA hereinafter). This function includes a method using a contrast agent and a method using no contrast agent.

In a common method using a contrast agent, a gradient echo type sequence of short TR (repetition time) is used in combination with a T1-shortening type contrast agent such as Gd-DTPA. The principle of this method will be explained briefly. In the MRI apparatus, when excitation by an RF magnetic field is repeatedly performed at a short interval of several tens of milliseconds for the same area, nuclear spins (sometimes referred to simply as "spins" hereinafter) included in tissues of the area saturate and, consequently, the strength of NMR signals (echo signals) obtained therefrom decreases. On the other hand, blood spins containing a T1 shortening contrast agent are not likely to be saturated by the repeated excitation of a short TR because the blood spins have a shorter T1 than those of surrounding tissues, and generate high-strength signals relative to the surrounding tissues. As a result, blood vessels filled with blood containing a contrast agent can be visualized with high contrast relative to the other tissues. Utilizing this fact, NMR measurement of the region is conducted while the contrast agent remains in the blood, of the region concerned, and the obtained three-dimensional image data are processed to image the blood vessel.

Although the MRA can thus visualize the blood containing a contrast agent as high-strength signals, when small blood vessels are to be imaged, it often cannot provide sufficient contrast difference between the small blood vessels and the surrounding tissues. In order to overcome this problem, as shown in FIG. 16, subtraction operation is often conducted between images obtained before and after administration of the contrast agent to delete the tissue other than the blood vessels. This method is called 3D-MRA-DSA (Digital Subtraction Angiography).

In clinical diagnosis of diseases, not only arterial vessels but venous vessels are required to be imaged. As is well known, in the blood circulation system of a living body, blood from the heart passes through arterial vessels, tissues and venous vessels, and back to the heat via heat-lung heart circulation. Accordingly, when a contrast agent is injected into an elbow vein, the contrast agent mixed with blood goes to the heart first, and then out from the heart to enable visualization of arterial vessels, capillary vessels and venous vessels in this order. This means the contrast MRA measurement should be performed successively over plural time phases in order to image the vessel of interest. This imaging method is called dynamic MRA. Various kinds of contrast MRA are described in detail in "3D Contrast MR Angiography" (2nd edition. Prince MR Grist TM and Debatin JF Springer, P3–P39, 1988).

In the aforementioned contrast MRA measurement techniques, it is necessary for the blood in the vessel of interest to be imaged to have optimum density of the contrast agent at the measurement time, and for the optimum density to be maintained for a certain period of time in order to obtain good image quality. In addition, the contrast agent density should be constant during measurement of low frequency components of the k-space in order to image blood vessels with high contrast.

However, as shown in FIG. 16, the time when the contrast agent density reaches its optimum value differs depending on the site A, B, C even within the same blood vessel. Arrival time difference of the optimum density depends on the blood circulation time of the patient. Accordingly, if the measurement is started too early relative to administration of a contrast agent, the contrast agent will not yet have reached all parts of the blood vessel of interest and, as a result, the blood vessel cannot be imaged. On the other hand, when the start time of the measurement is late, the contrast agent will have already left the region of the blood vessel of interest. As a result, the contrast of the blood vessel becomes low and other unnecessary vessels are imaged. Thus, it has been impossible to image only the blood vessel of interest with high contrast.

Further, if the start of the measurement is mistimed, then when the venous system is imaged successively after imaging of the arterial system, not only a vein image but also an artery image is obtained and, as a result, the two are not distinguishable.

The present invention aims at solving the above-mentioned problems and one object of the present invention is to provide an MRI method capable of imaging the entire blood vessel of interest with high contrast and displaying images useful for diagnosis. Another object of the present invention is to image veins and arteries in a distinguishable manner.

DISCLOSURE OF THE INVENTION

In one aspect, the present invention provides a magnetic resonance imaging method comprising the steps of applying a static magnetic field, gradient magnetic field and RF magnetic field to an object to be examined according to a predetermined pulse sequence, causing nuclear magnetic resonance in nuclear spins within a predetermined region of the object, measuring NMR signals caused by the NMR, and producing and displaying images using the measured signals, wherein a plurality of time-series NMR signal groups are obtained, on an individual image basis, for the same region of the object, one of the plurality of NMR signal groups is defined as standard data, a plurality of subtracted NMR signal groups are produced by performing a subtraction operation between the standard NMR signal group and the other NMR signal groups, the subtracted NMR signal groups are subjected to addition operation and a NMR signal group subtraction obtained by the addition operation is displayed.

In the addition operation, each of the subtracted NMR signal groups is weighted using a weighting coefficient. The weighting coefficient is determined based on the signal intensity of the NMR signal group difference. Weighting coefficients having different signs are used.

The magnetic resonance imaging method of the present invention further comprises a step of administering a contrast agent into the object to be examined, wherein the standard NMR signal group is measured before the contrast agent arrives at a predetermined portion of the object and the other NMR signal groups are measured while the contrast agent travels within the predetermined region of the object.

Each of the NMR signal groups is capable of producing a two-dimensional image or three-dimensional image. The obtained NMR signal groups may be subjected to subtraction and cumulative addition or weighted addition after each is reconstructed into image data or may be subjected to a subtraction as measured complex signals.

In an other aspect, the present invention provides an MRI apparatus comprising means for applying a static magnetic field, gradient magnetic field and RF magnetic field to an object to be examined by driving respective magnetic field generating units, means for detecting NMR signals emitted, from the object by NMR, means for performing an image reconstruction operation using the NMR signals detected by the detecting means, and means for displaying the obtained images, wherein the apparatus further comprises means for generating a plurality of NMR signal groups, on an individual image basis, for the same region of the object by controlling the magnetic field generating units, means for detecting and storing the plurality of NMR signal groups, means for generating a plurality of subtracted NMR signal groups by performing a subtraction operation between one standard NMR signal group and the other NMR signal groups, means for adding each of the plurality of subtracted NMR signal groups and means for displaying the result of the addition as an image.

The means for addition includes means for determining individual weighting coefficients for the plurality of subtracted NMR signal groups to be added.

The MRI apparatus of the present invention further comprises means for administering a contrast agent into the object to be examined, wherein the standard NMR signal group is measured before administration of the contrast agent and the other NMR signal groups are measured successively while the contrast agent travels within the same region of the object.

BRIEF EXPLANATION OF DRAWINGS

FIG. 9 is an explanatory view of control of cumulative addition during signal processing of contrast MRA measurement.

FIG. 16 is an explanatory view of a conventional contrast MRA.

BEST MODE FOR CARRYING OUT OF THE INVENTION

The present invention will now be explained in detail with reference to the specific embodiments shown in the appended drawings.

Figure 5:
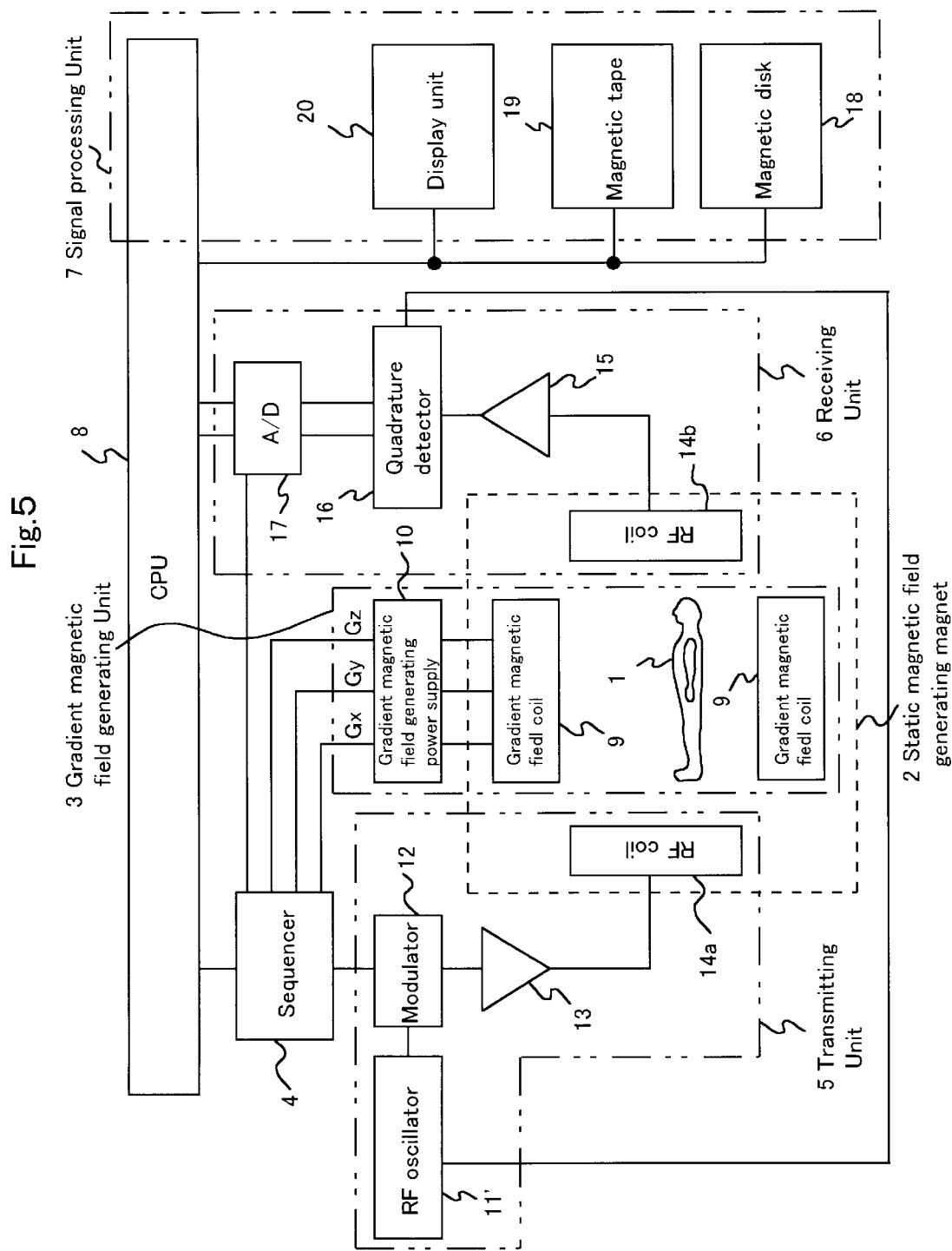
FIG. 5 is an overall block diagram representing a system of the MRI apparatus of the present invention.

FIG. 5 is an overall block diagram showing the system of an MRI apparatus according to the present invention. This MRI apparatus comprises a static magnetic field generating magnet 2, a gradient magnetic field generating unit 3, a transmitting unit 5, a receiving unit 6, a signal processing unit 7, a sequencer 4 and a central processing unit (CPU) 8.

The static magnetic field generating magnet 2 generates a uniform static magnetic field around an object to be examined in a direction parallel or perpendicular to the body axis of the object and comprises means for generating a static magnetic field in a space around the object such as a permanent magnet, a resistive magnet or a superconductive magnet. Within a magnetic field space surrounded by the magnet 2, there are disposed gradient magnetic field coils 9 of the gradient magnetic field generating unit 3, an RF coil 14a of the transmitting unit 5 and an RF coil 14b of the receiving unit 6, which will be explained later.

The gradient magnetic field generating unit 3 consists of gradient magnetic field coils 9 wound in the directions of three axes, X, Y, and Z, and a gradient magnetic field power supply 10 for driving the gradient magnetic field coils. The gradient magnetic field power supply 10 is driven according to instructions from a sequencer 4 (explained later) and applies gradient magnetic field Gx, Gy, and Gz in the direction of the three axes, X, Y, and Z, to the object. A slice plane of the object 1 is determined by selecting the amplitudes of these gradient magnetic fields.

The sequencer 4 is for repeatedly applying RF pulses in a given pulse sequence to cause nuclear magnetic resonance of nuclei of atoms constituting the living tissues of the object 1. The sequencer 4 operates under the control of the CPU 8, and sends necessary instruction for collecting data for obtaining tomograms of the object 1 to the transmitting unit 5, the gradient magnetic field generating unit 3 and the receiving unit 6.

The transmitting unit 5 is for producing an RF magnetic field in order to cause nuclear magnetic resonance of nuclei of atoms constituting the living tissues of the object 1 in accordance with the RF pulse transmitted from the sequencer 4, and consists of an RF oscillator 11, a modulator 12, an RF amplifier 13 and an RF coil for transmission 14a. The transmitting unit 5 amplitude-modulates the RF pulses output from the RF oscillator 11 by the modulator 12 in accordance with instructions from the sequencer 4. The amplitude-modulated RF pulses are amplified by the RF amplifier 13 and supplied to the RF coil 14a located in the vicinity of the object 1 so that electromagnetic waves are radiated onto the object 1.

The receiving unit 6 is for detecting echo signals (NMR signals) elicited through nuclear magnetic resonance of atomic nuclei of the living tissues of the object 1, and consists of an RF coil 14b for receiving electromagnetic waves, an amplifier 15, a quadrature phase detector 16 and an A/D converter 17. In this configuration, echo signals detected by the RF coil 14b are amplified by the amplifier 15 and input into the quadrature phase detector 16, where the signals are detected using reference signals having phase shift of 90° respectively to become two-series data. The data is converted into digital signals by the A/D converter 17 and transferred to the signal processing unit 7.

The signal processing unit 7 consists of the CPU 8, recording media such as a magnetic disk 18 and magnetic tape 19, and a display unit 20 such as a CRT. The CPU 8 performs operations such as Fourier transform, calculation of a correction coefficient and image reconstruction, and thereby produces and displays a signal intensity distribution or images obtained by subjecting a plurality of signals to suitable arithmetic operations on a certain section as a tomogram on the display unit 20.

In addition, the signal processing unit 7 of the MRI apparatus of the present invention is provided with a function of performing subtraction and weighted addition for image data as a function of the CPU 8. Such operations are carried out on time-series data obtained by continuous measurement. The CPU 8 is provided with means for selecting and setting these processes as input means. Corresponding to the function of the signal processing unit 7, the display 20 has a function of displaying time-difference images or cumulative-added images together with or instead of ordinary images.

Next, a first embodiment of an MRA method of producing blood images by performing subtraction and weighted addition operation on image data will be explained with reference to FIG. 1 and FIG. 3(a). First, an object to be examined is placed in a space within the static magnetic field generating magnet, and measurement for a region including the blood vessels of interest is conducted before and after injection of a contrast agent (step: 301). The measurement is performed successively for the same slice or slab under identical conditions. The kind of pulse sequence is not particularly limited but a pulse sequence based on a three-dimensional gradient echo method, which is a common pulse sequence for MRA, is employed in the example explained hereinafter. Since this exemplified measurement aims at imaging blood flow, a gradient magnetic field for rephasing a diphase caused by blood flow, i.e., Gradient Moment Nulling (GMN), may be employed. However, GMN is not a necessary component for the pulse sequence and a simple gradient echo sequence is rather preferable to shorten TR/TE. Measurement data groups 301a, 301b, 301c, 301d obtained by performing the pulse sequence are 3D time-series data groups of the same region including blood vessels, each of which constitutes data for one image. These measurement data groups are stored in a memory medium of the signal processing unit 7.

The signal processing unit 7 reads out the 3D time-series data groups individually from the memory medium and performs an image reconstruction 302 such as 3D-Fourier transform (step: 302) to obtain time-series three-dimensional image data groups 303a, 303b, 303c and 303d (step: 303).

Then, the subtraction between the 3D time-series data group 303a obtained before injection of a contrast agent and each of data 303b, 303c and 303d obtained after injection of a contrast agent is calculated (step: 304). This subtraction operation may be conducted on the complex data or the absolute values of the data. The subtraction should be conducted between slices of the same position in the 3D-data. Signals of tissue other than contrast blood vessels are eliminated by the subtraction operation, and a contrast agent distribution image (temporal subtraction image) 305a, 305b or 305c can be obtained for each measurement time (step: 305).

Next, these time-series contrast agent distribution images 305a, 305b and 305c are subjected to weighted addition (step: 306). The weighting coefficients k1, k2, k3 . . . , which are given to each image in the weighted addition, are determined based on signal intensity of blood vessels so that, for example, a weighting coefficient for an image having high ability to image the blood of interest high and the, sum of the weighting coefficients becomes 1. Determination of the coefficients can be done manually or automatically. In the manual mode, the coefficients are determined by observing time-series images (images of a given slice) displayed on the display unit 20.

The coefficients are determined automatically by, for example, finding a signal value or a sum of signal values S1, S2, S3 . . . of one or more pixels of the blood vessel of interest of each time-series image and dividing the signal value (or the sum) by the sum of all of the signal values to obtain a quotient $(S_i/\Sigma S_i)(i=1, 2, 3 \ldots)$ as a weighting coefficient. By using the weighting coefficient, solely the blood vessel of interest can be imaged with high contrast.

If time-series images are collected for a relatively long time while the contrast agent travels from artery to vein, the vein and artery can be distinguished using weighting coefficients having positive/negative signs. In this case, the above-mentioned weighting coefficient $S_i/\Sigma S_i$ may be applied for time-series images where a signal value Si of one or more pixels of a given arterial vessel is not less than a threshold value S0, and a weighting coefficient of opposite sign $(-S_j/\Sigma S_j)$ is applied for images where the signal value Si is less than the threshold value S0 and signal value Sj $(j=1, 2, 3 \ldots, i \neq j)$ of one or more pixels of a given vein is not less than the threshold value S0. Thus, the opposite signs are applied to the vein and artery so that contrast difference between them is enhanced to distinguish the artery and vein. When MIP (Maximum Intensity Projection) is performed successively in the above-mentioned process, signals of unnecessary veins can be suppressed to produce an image of arteries alone.

Alternately, the above-mentioned weighting coefficient $S_i/\Sigma S_i$ may be applied for time-series images where a signal value Si of one or more pixels of arteries or veins is not less than a threshold value S0, and a weighting coefficient of 0 is applied for images where a signal value Sj $(j=1, 2, 3 \ldots, i \neq j)$ is not less than a threshold value S0.

After the weighting coefficients are thus determined, images are multiplied with a corresponding weighting coefficient and added. The addition is performed on slices of the same slice position in the 3D-image data. This process provides a 3D-image data 307*a* in which time progress of travel of the contrast agent through the blood vessel of interest has been cumulated (step: 307).

The 3D-image data 307*a* obtained by the weighted addition is subjected to a projection process as occasion demands (step: 308) to produce a projection blood image 309*a* (step: 309). The projection blood image 309*a* is displayed on the display unit 20.

Figure 6:
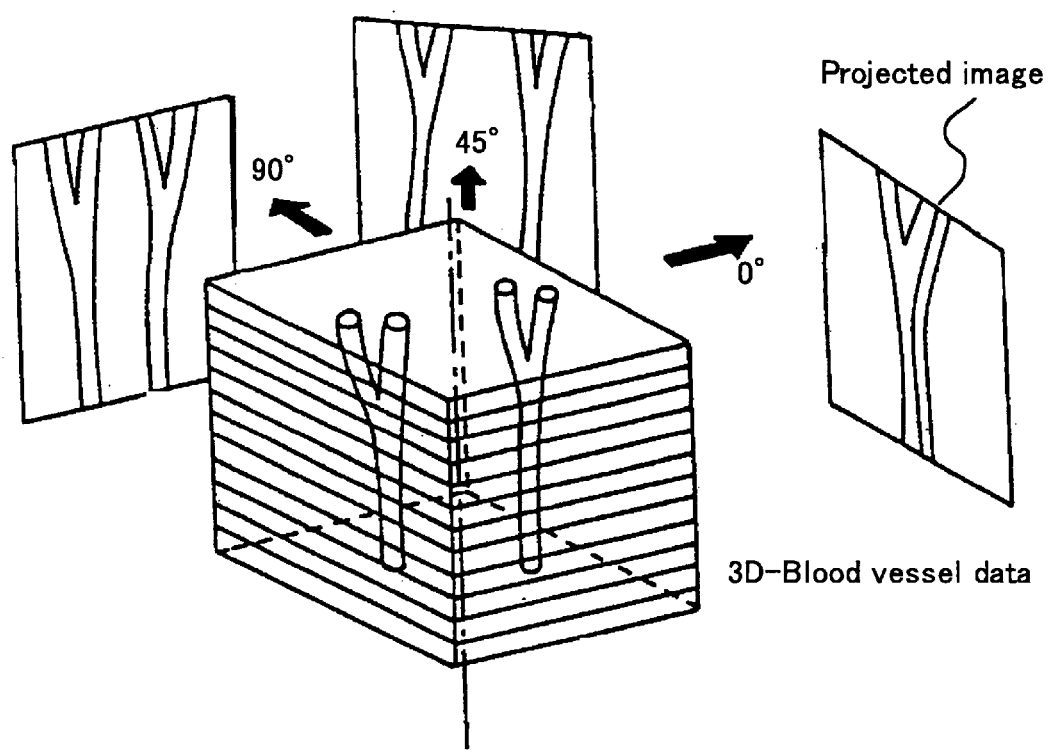
FIG. 6 is an explanatory view of a projection process in MRA.

The projection process is a process of obtaining a two-dimensional projection image by projecting 3D-data as shown in FIG. 6 in an arbitrary direction such as a coronal direction, sagittal direction or transversal direction. One common projection process in the art is the Maximum Intensity Projection (MIP) method in which signals having a maximum value on a given light axis transmitting the 3D-image data are considered to be blood signals and the maximum values residing on a plurality of light axes are projected to form a single projection image. Although a part where the contrast agent density is high is represented in black and the background is represented in white in FIG. 1, actually the background with low signal value becomes black and the part with high signal value, i.e., blood, becomes white in the MIP method. Further, although only one projection image is illustrated in FIG. 1, a plurality of projection images projected in different directions may be produced and displayed.

Instead of MIP, analogous three-dimensional processing such as volume rendering or simple integration of all slices may be performed.

Figure 1:
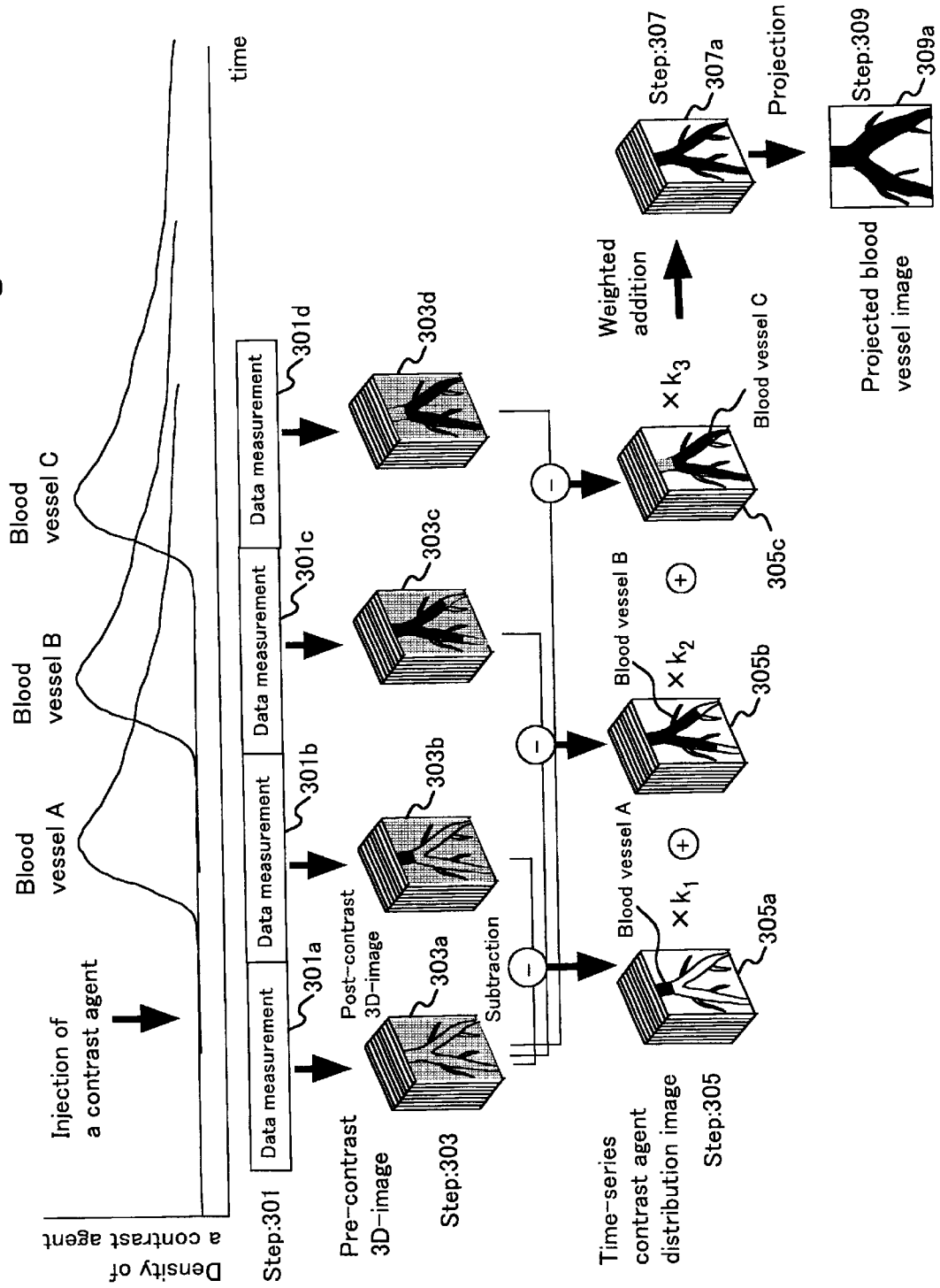
FIG. 1 is an explanatory view of a first embodiment of contrast MRA measurement performed in the MRI apparatus according to the present invention.
Figure 2:
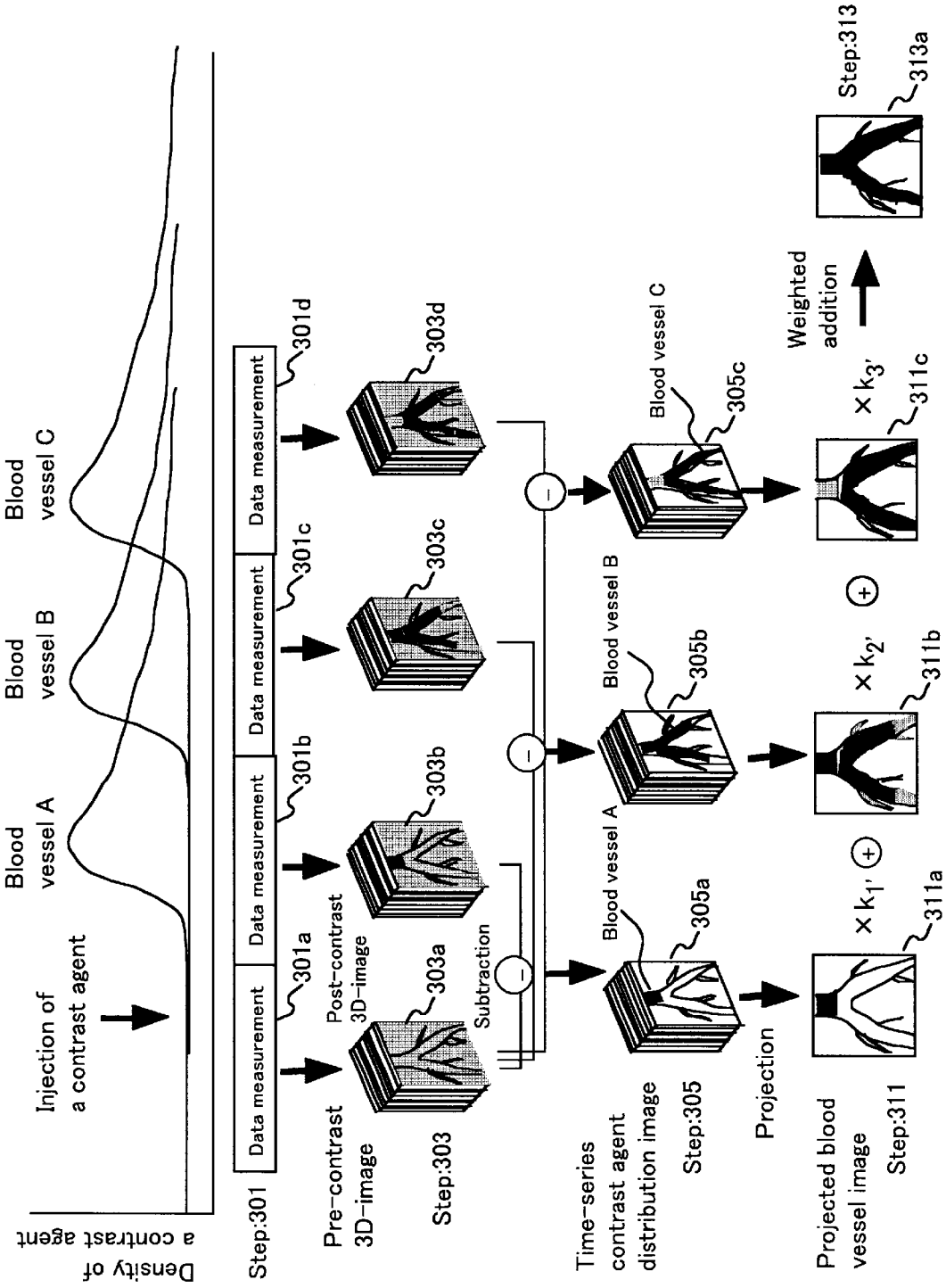
FIG. 2 is an explanatory view of another example of contrast MRA measurement performed in the MRI apparatus according to the present invention.
Figure 3:
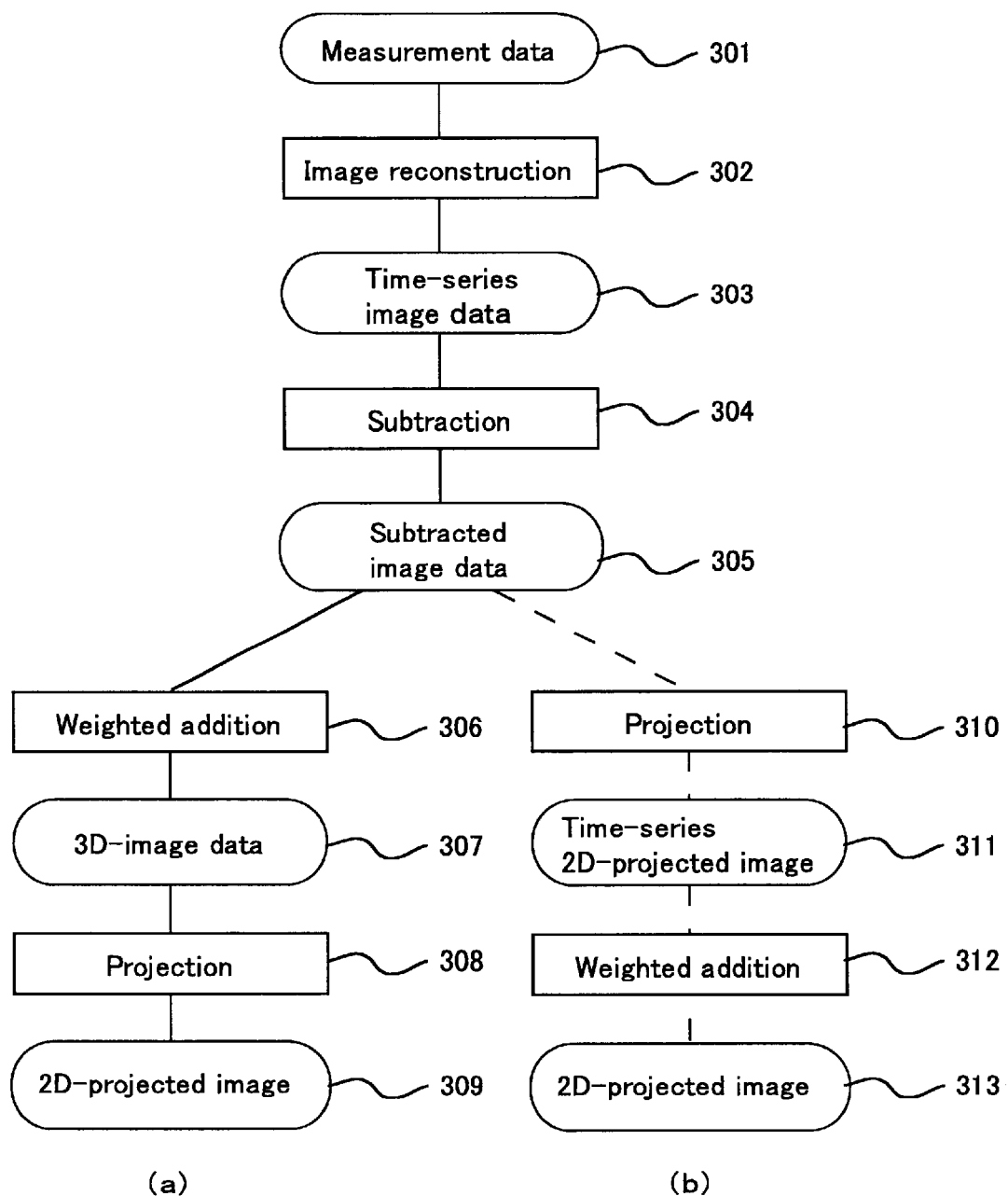
FIGS. 3(a) and 3(b) are flow charts showing the sequence of processing steps of the MRA measurement shown in FIGS. 1 and 2 respectively.

In the embodiment shown in FIG. 1 and FIG. 3(*a*), time-series images are projected after the images are weighted and added. Alternatively, the time-series images may be projected first and then the obtained 2D-projection images may be weighted and added. Such an embodiment is illustrated in FIG. 2 and the flow chart (dotted-line portion) of FIG. 3(*b*).

In this embodiment, steps of performing reconstruction of time-series data 301*a*, 301*b*, 301*c* and 301*d* obtained by 3D-measurement to obtain time-series images 303*a*, 303*b*, 303*c* and 303*d*, and performing a subtraction operation between the image data 303*a* obtained before administration of a contrast agent and the image data 303*b*, 303*c* and 303*d* obtained after administration of a contrast agent to obtain time-series contrast agent distribution image groups (subtracted image data) 305*a*, 305*b* and 306*c* are similar to those in the embodiment shown in FIG. 1 (steps 301–305 in FIG. 3(*a*)). After these steps, a projection process is performed prior to a weighted addition operation (step: 310). The projection is performed in one or more of arbitrary directions using the MIP method as in the aforementioned embodiment to obtain one or plural 2D-projection images 311*a*, 311*b*, 311*c*.

Then, the 2D-projection images are weighted and added (step: 312) to obtain an added 2D-projection image 313*a*. Weighting coefficients k1', k2', k3' . . . used in this process are determined manually or automatically in the same manner as in the aforementioned embodiment. In this embodiment, subtracted image data or a 2D-projection image can be used as a base image for determining the weighting coefficients. In this case also, a weighting coefficient $Si/\Sigma Si$ may be found from a signal value $Si$ of a specific pixel for each image, and the coefficient may have positive/negative sign to eliminate one of artery and vein.

This embodiment is useful when projection is conducted in only one direction because the processing volume of the weighted addition is less than that of the embodiment shown in FIG. 1. However, the embodiment of FIG. 1 is suitable for obtaining projection images in a plurality of directions as final added images.

Figure 4:
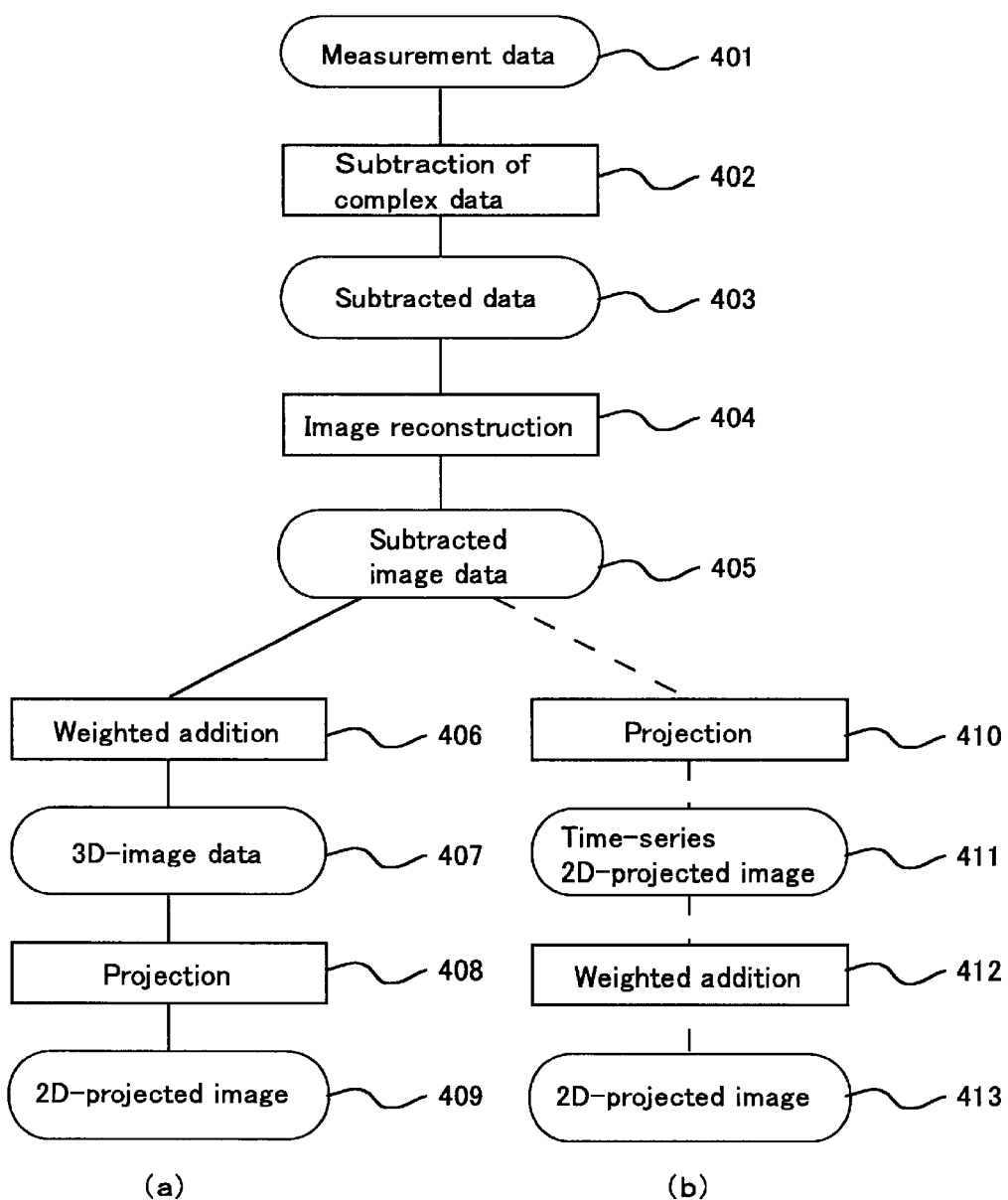
FIG. 4 is a flow chart of another example of contrast MRA measurement performed in the MRI apparatus according to the present invention.

Although the weighted addition and projection processes are performed after reconstruction and subtraction of measurement data in the above-mentioned embodiments, temporal subtraction may be performed for each of the time-series measurement data. Such an embodiment is illustrated in FIG. 4.

In this embodiment, a set of data 301*a* (data necessary for reconstruction of, for example, a 3D-image) obtained before administration of a contrast agent is determined as standard data, and subtraction is performed between the standard data and each of the time-series data 301*b*, 301*c*, 301*d* obtained after administration of a contrast agent (step: 402) to obtain subtracted data (step: 403). Thereafter, the subtracted data are subjected to reconstruction (step: 404) to obtain time-series subtracted image data (step: 405). Weighted addition (step: 406, or step: 412) and projection (step: 408, or step: 410) are conducted for the subtracted image data. The weighted addition and projection can be performed in the same manner as in the aforementioned embodiments and either of them can proceed as shown in FIG. 4(*a*) and FIG. 4(*b*) (dot line).

According to this embodiment, a higher processing speed can be obtained than in a case of performing subtraction between image data because measurement data is subjected to subtraction prior to reconstruction. The order of processing can be selected taking account of the performance of the CPU 8 and image quality.

Although 3D-measurement data is used as measurement data in the above explanation, even 2D-measurement data can be subjected to subtraction and weighted addition similarly to obtain the same effect.

As explained above, according to the first embodiment of the present invention, since the signal processing unit performs weighted addition on a plurality of time-series image data obtained by temporal-subtraction based on the blood imaging ability of each image, the blood imaging ability can be improved by the post-measurement processes that are completely independent from the measurement. Thereby the problems of conventional MRA, i.e., that the blood vessel of interest cannot be sufficiently imaged depending on the injection time and blood circulation speed, can be eliminated. In addition, even regions where veins overlap arteries can be displayed distinguishably.

Next, a second embodiment of the present invention will be explained. In this embodiment, the weighted addition performed in the first embodiment is replaced by a simple cumulative addition. In the MRI apparatus of this embodiment, the signal processing unit 7 is provided with a function of performing subtraction and cumulative addition as a function of the CPU 8. These processes are conducted for time-series data obtained by performing continuous measurement using the MRI apparatus. Means for selecting or setting these processes (control of start and end) may be provided as an input means of the CPU 8. Corresponding to the function of the signal processing unit 7, the display unit 20 has a function of displaying temporal subtraction images or cumulative added images together with or instead of ordinary images.

Next, an example of the second embodiment of a contrast MRA method will be explained with reference to FIG. 7 and FIG. 8(*a*). First, an object to be examined is placed in a space within the static magnetic field generating magnet and measurement for a region including the blood vessels of interest is conducted before and after projection of a contrast agent. The measurement is performed successively for the same slice or slab under identical conditions. The kind of pulse sequence is not particularly limited but a pulse sequence based on a three-dimensional gradient echo method, which is a common pulse sequence for MRA, is employed in the example explained hereinafter. Since this exemplified measurement aims at imaging blood flow, a gradient magnetic field for rephasing a diphase caused by blood flow, i.e., Gradient Moment Nulling (GMN), may be employed. However, GMN is not a necessary component for the pulse sequence and a simple gradient echo sequence is rather preferable to shorten TR/TE.

Measurement data groups 501a, 501b, 501c, 501d, 501e, 501f, 501g obtained by performing the pulse sequence are 3D time-series data groups of the same region including blood vessels (step: 501). The signal processing unit 7 performs an image reconstruction such as 3D-Fourier transform for each of the 3D-time-series data groups to obtain three-dimensional image data groups 502a, 502c, 502d, 502e, 502f, 502g (step: 502).

Then, subtraction between the 3D time-series data group 502a obtained before administration of a contrast agent and those obtained after administration of a contrast agent 503c, 503d, 503e, 503f, 503g is conducted (step: 503). The subtraction operation may be conducted on the complex data or the absolute value of data. The subtraction should be conducted between slices of the same position in the 3D-data. Signals of tissue other than blood vessels are eliminated by the subtraction, and contrast agent distribution images (temporal subtraction images) 503a, 503b, 503c, 503d, 503e can be obtained for each measurement time. The subtraction may be started from a first 3D image data 501b obtained first after injection of a contrast agent, or, may be started at a predetermined time after the injection, i.e., a time when the contrast agent density of the blood vessel of interest is presumed to attain a certain density value. The start time of the subtraction process may be controlled manually or automatically together with control of a cumulative addition process.

Next, these time-series contrast agent distribution images are subjected to projection respectively to obtain projected blood images 504a, 504b, 504c, 504d and 504e (step: 504). The projection process is a process of obtaining a two-dimensional projection image by projecting 3D-data as shown in FIG. 6 in an arbitrary direction such as a coronal direction, sagittal direction or transaxial direction. One common projection process in the art is the Maximum Intensity Projection (MIP) method in which signals having a maximum value residing on a given light axis transmitting the 3D-image data are considered to be blood signals and the maximum values on a plurality of light axes are projected to form a single projection image. Although a part where the contrast agent density is high is represented in black and the background is represented in white in FIG. 7, actually the background with low signal value becomes black and a part with high signal value becomes white in the MIP method. Further, although only one projection image is illustrated in FIG. 7, a plurality of projection images projected in different directions may be produced and displayed.

Next, the time-series projection images 504a, 504b, 504c, 504d and 504e produced in the same direction are cumulatively added (step: 505). Thus, an image 506a in which blood of interest is imaged with high contrast can be displayed (step: 506). The cumulative addition is preferably performed at least from the time when the contrast agent arrives at one end of the blood vessel of interest till the time the contrast agent arrives at the other end. The beginning and end of the cumulative addition can be determined independently of measurement. For example, as shown in FIG. 9(a), the cumulative addition may be started at the time when the end c of the vessel of interest in the FOV (field of view) becomes a high signal and may be ended at the time when the other end a also becomes a high signal. Such a control of the cumulative addition process may be done manually or automatically. In the manual mode, control of start or end is input into CPU 8 while observing time-series images (projection images) or cumulatively added projection images on display unit 20, which are updated intervals equal to the measurement interval.

In order to start and end the cumulative addition properly, both the time-series projection images and the cumulatively added images are displayed while being updated.

Automatic control is conducted by automatically monitoring a signal value of pixel a within the blood vessel of interest. For example, assuming that the signal value of pixel a shown in FIG. 9(a) is Sa and the signal value of pixel b within a blood vessel other than the blood vessel of interest is Sb, the cumulative addition is continued during Sa and Sb to satisfy Sa>Sr1 and Sb>Sr2 (where Sr1 and Sr2 are predetermined threshold values) and ended at the time when Sb becomes Sb>Sr2. In this case, the addition can be started from the beginning of the measurement. The threshold values Sr1 and Sr2 may be the same or different but should be determined as values higher than that of background signal.

In a case that a vein is also to be imaged after an artery has been imaged, the addition operation may be started at a time when a signal value Sa of a given pixel within the arterial system becomes smaller than Sr2 (Sa<Sr2), and continued for as long as the signal value Sv of a pixel within the venous system of interest satisfies Sv>Sr1 and Sa satisfies Sa<Sr2.

As another method of automatically controlling the beginning and end of the cumulative addition, signal values of all pixels of the image may be monitored. In this method, the number of pixels whose signal values exceed a predetermined threshold is monitored and the cumulative addition is ended at the time when the number becomes a predetermined number or more. Since the cumulative addition can be controlled independently of the blood flow speed of the examined object by monitoring of the number of pixels having a signal value higher than the predetermined value, the pixel number for the examined portion can be stored in memory to give the MRI apparatus learning capability.

As yet another method, the ending time of the cumulative addition may be determined by forecasting the blood flow speed of the object using the time range from injection of a contrast agent (contrast start time) till the blood vessel end c in the FOV obtains a high signal value. In this case, the time range t from the contrast start time till the signal value Sc of a pixel located at the vessel end c shown in FIG. 9(c) becomes high is measured, and the blood flow speed is calculated using the distance between the injection point and the vessel end c. Then the time when the contrast agent will reach the other end d is calculated (forecasted) based on the blood flow speed and the cumulative addition is continued up to the calculated time.

By controlling the cumulative addition manually or automatically as explained above, solely the blood vessel of interest can be imaged with high contrast. The cumulative addition can be controlled independently of measurement. For example, if the addition is finished before imaging another blood vessel, it does not matter whether the measurement is continued afterward, and the addition may be started again if images of the venous system are also required in addition to images of the arterial system as aforementioned. In order not to prolong the measurement time, time lag between measurement and displaying of the added image should be within a range from several seconds to several tens of seconds.

Specifically, since the pulse sequence employed for the measurement has a short TR (approximately 5 ms–10 ms) and time-series images are acquired at intervals of less than about 1–10 s, the images are displayed and updated at approximately the same time intervals as those of the measurement after each process has been performed. Accordingly, the measurement and displaying of time-series images can be repeated until the blood vessel of interest comes to be imaged sufficiently while the operator monitors the displayed images.

Figure 7:
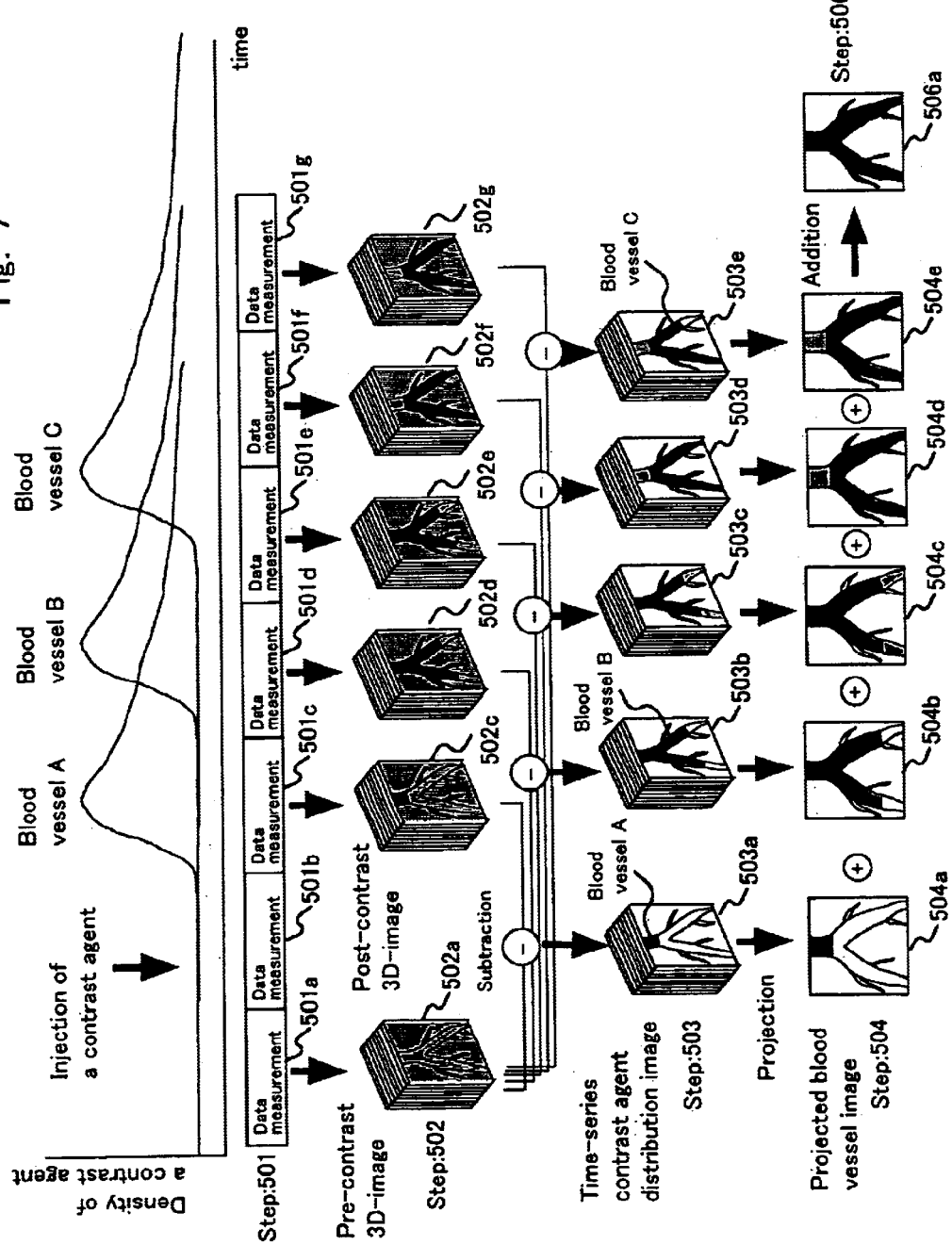
FIG. 7 is an explanatory view of a second embodiment of contrast MRA measurement performed in the MRI apparatus according to the present invention.
Figure 8:
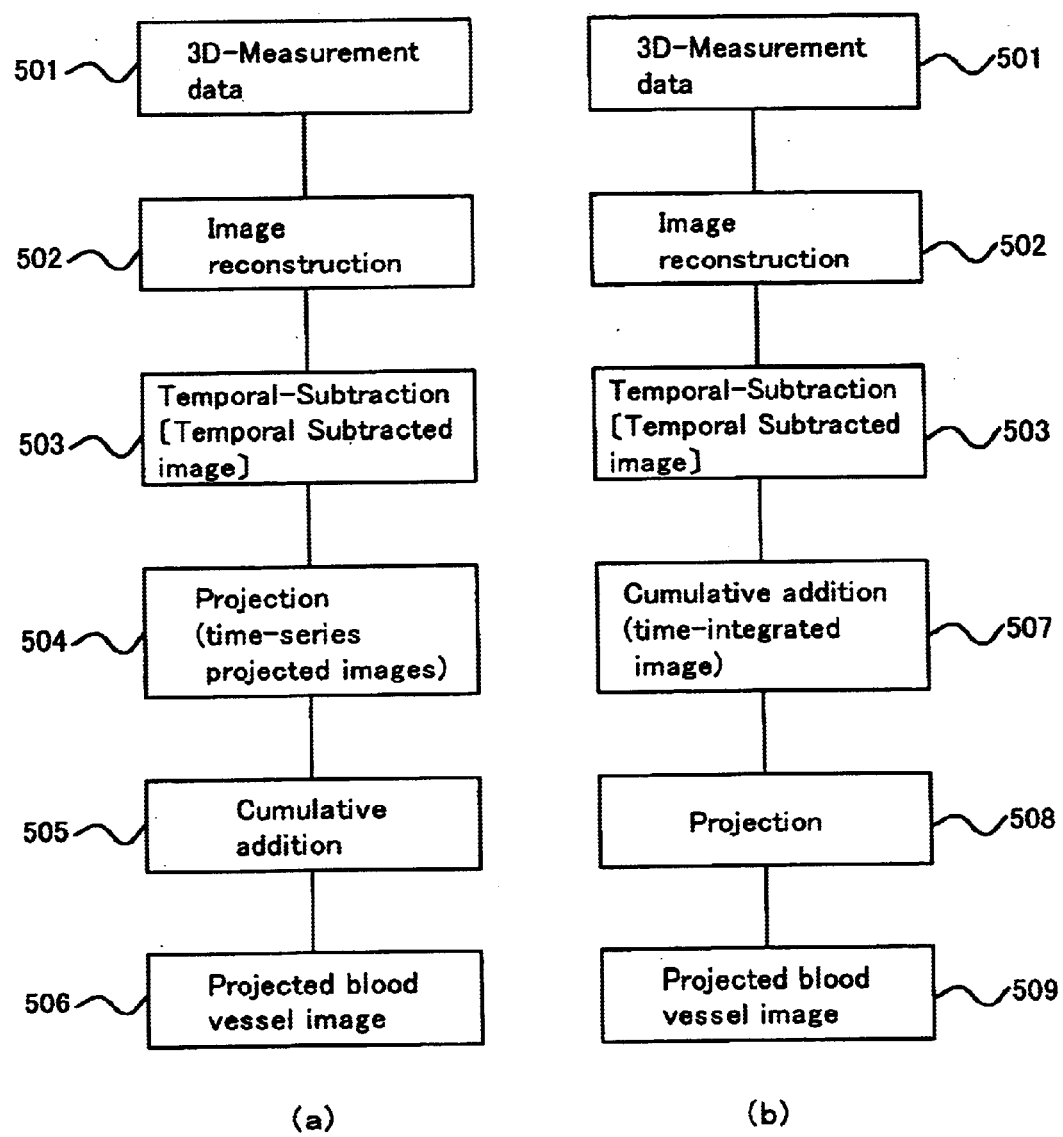
FIG. 8 is a flow chart of the sequence of processing steps of the contrast MRA measurement shown in FIGS. 7 and 10.

There has been explained in the example of FIG. 7 and FIG. 8(a) the case in which cumulative addition is performed on time-series images after projection. Alternatively, the cumulative addition may be performed on time-series contrast agent distribution images. Such an example is shown: in FIG. 10 and FIG. 8(b). In this embodiment also, the same steps as those of the embodiment of FIG. 7(steps 501–503, FIG. 8(a)) are carried out. Specifically, after time-series data obtained by 3D-measurement are reconstructed, subtraction is performed between pre-administration image data and post-administration image data to obtain time-series contrast agent distribution image groups (temporal subtraction images). In this embodiment, however, the cumulative addition is performed prior to the projection process. The beginning and end of the cumulative addition is controlled manually or automatically in the same as in the aforementioned example. When the beginning and end of the cumulative addition are determined manually using a displayed image as a monitor in this embodiment, however, it is necessary to produce and display a specific slice image including the blood vessel of interest or a 2D-image by processing the 3D-image data sequentially for the monitor, since only 3D-image data has been obtained up to the time that the cumulative addition begins.

Similarly to the subtraction process, the cumulative addition is performed for slices in the same position in the contrast agent distribution image. The process can provide 3D-image data (time-integrated image) in which blood vessels are visualized with high contrast. Then projected blood images are produced by projection of the 3D-image data (steps: 508, 509). Similarly to the aforementioned example, one or plural projection images can be produced by projecting in one or more of arbitrary directions using the MIP method. Instead of MIP, an analogous three-dimensional processing such as volume rendering or simple integration of all slices may be performed.

Figure 10:
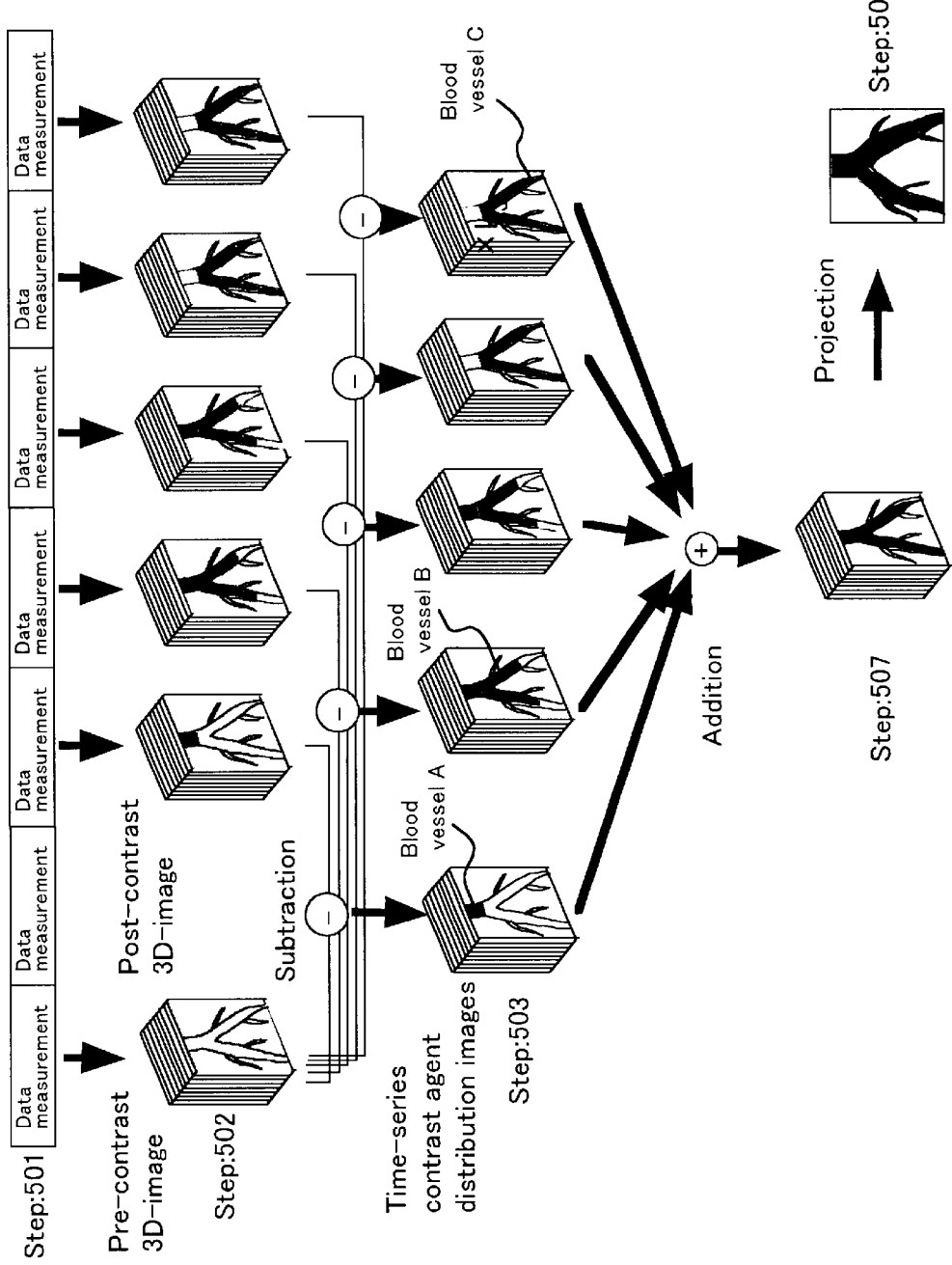
FIG. 10 shows another example of contrast MRA measurement performed in the MRI apparatus according to the present invention.

According to the exemplified method shown in FIG. 10, time lag between measurement and displaying of images can be reduced because an individual projection process is not necessary for each time-series difference image.

Figure 11:
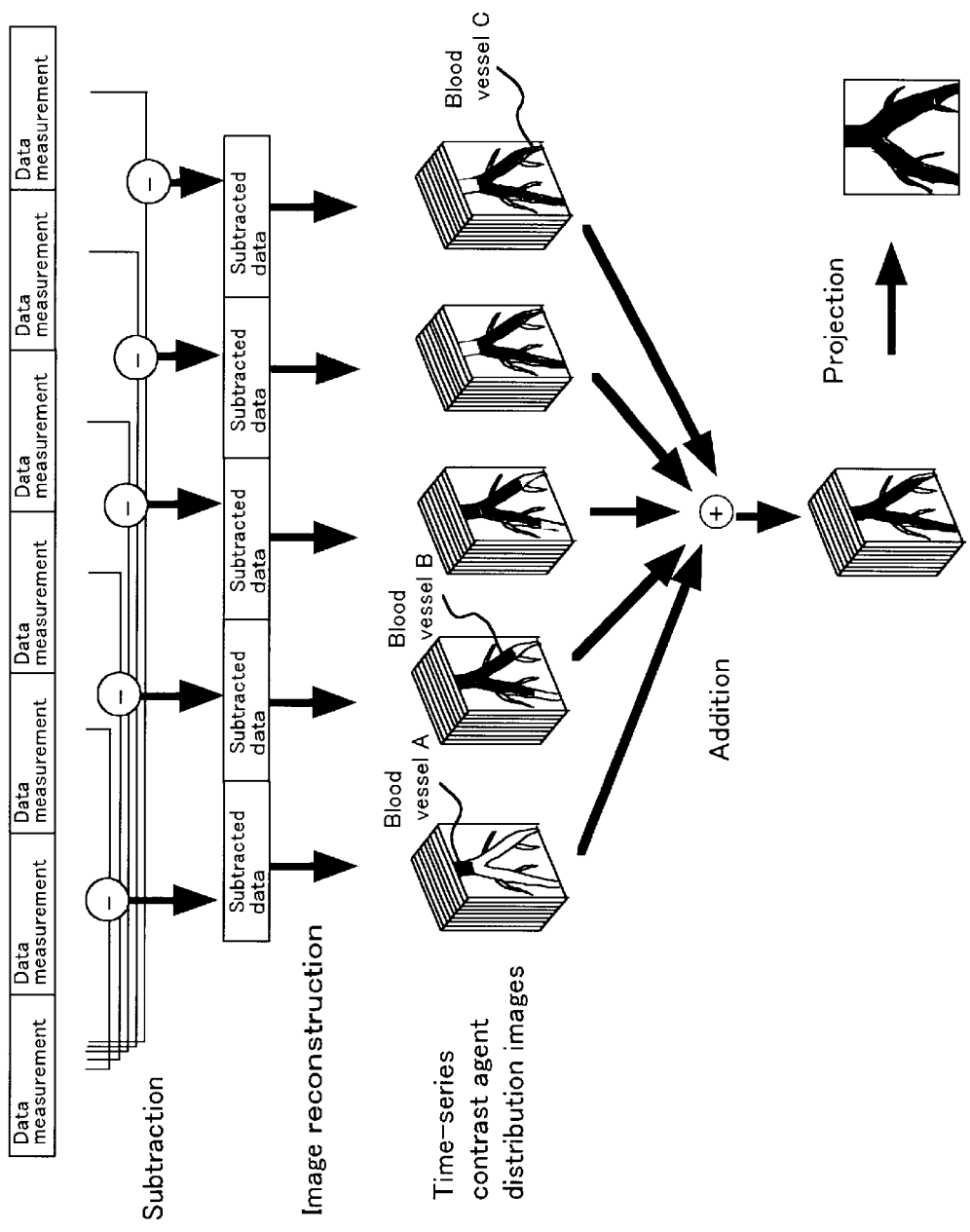
FIG. 11 shows another example of contrast MRA measurement performed in the MRI apparatus according to the present invention.
Figure 12:
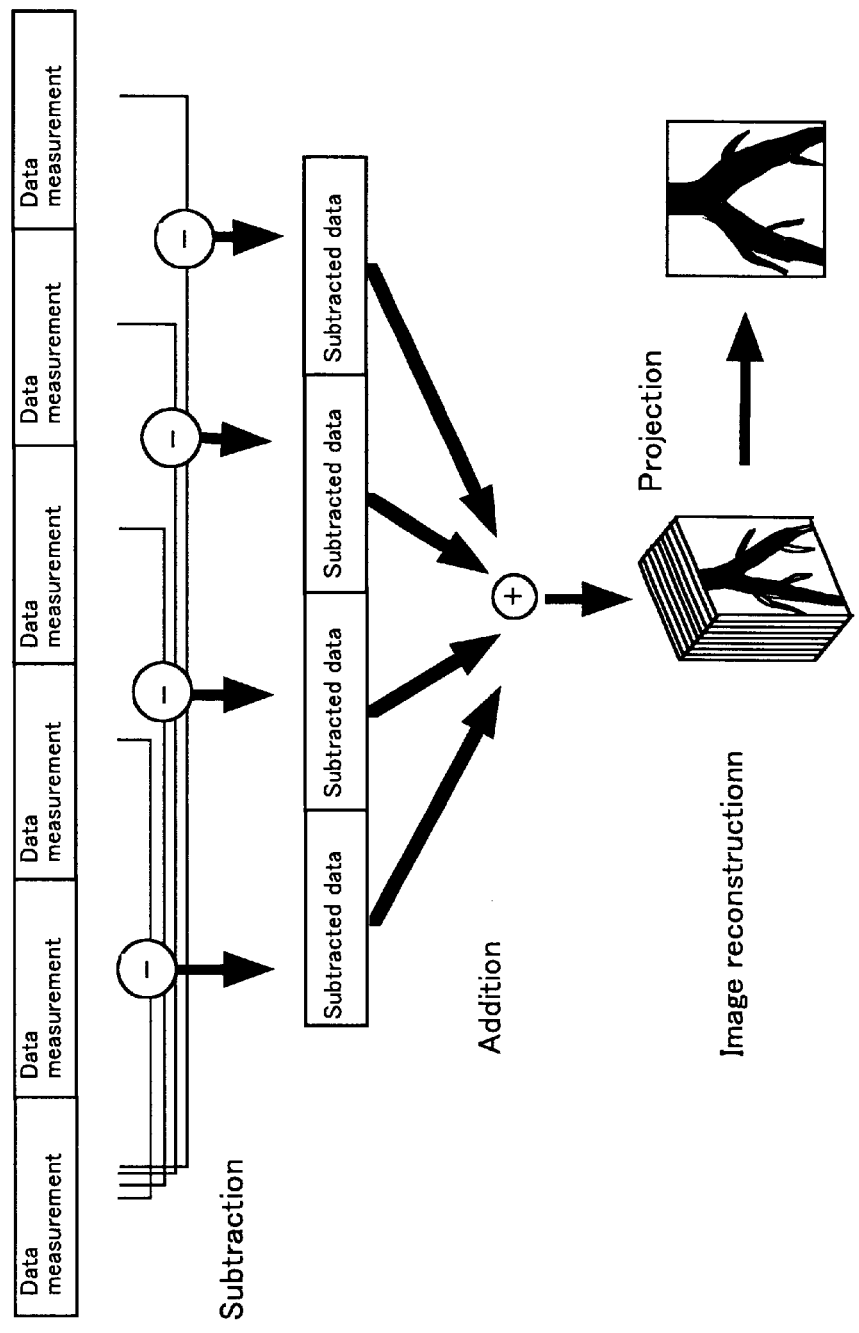
FIG. 12 shows another example of contrast MRA measurement performed in the MRI apparatus according to the present invention.
Figure 13:
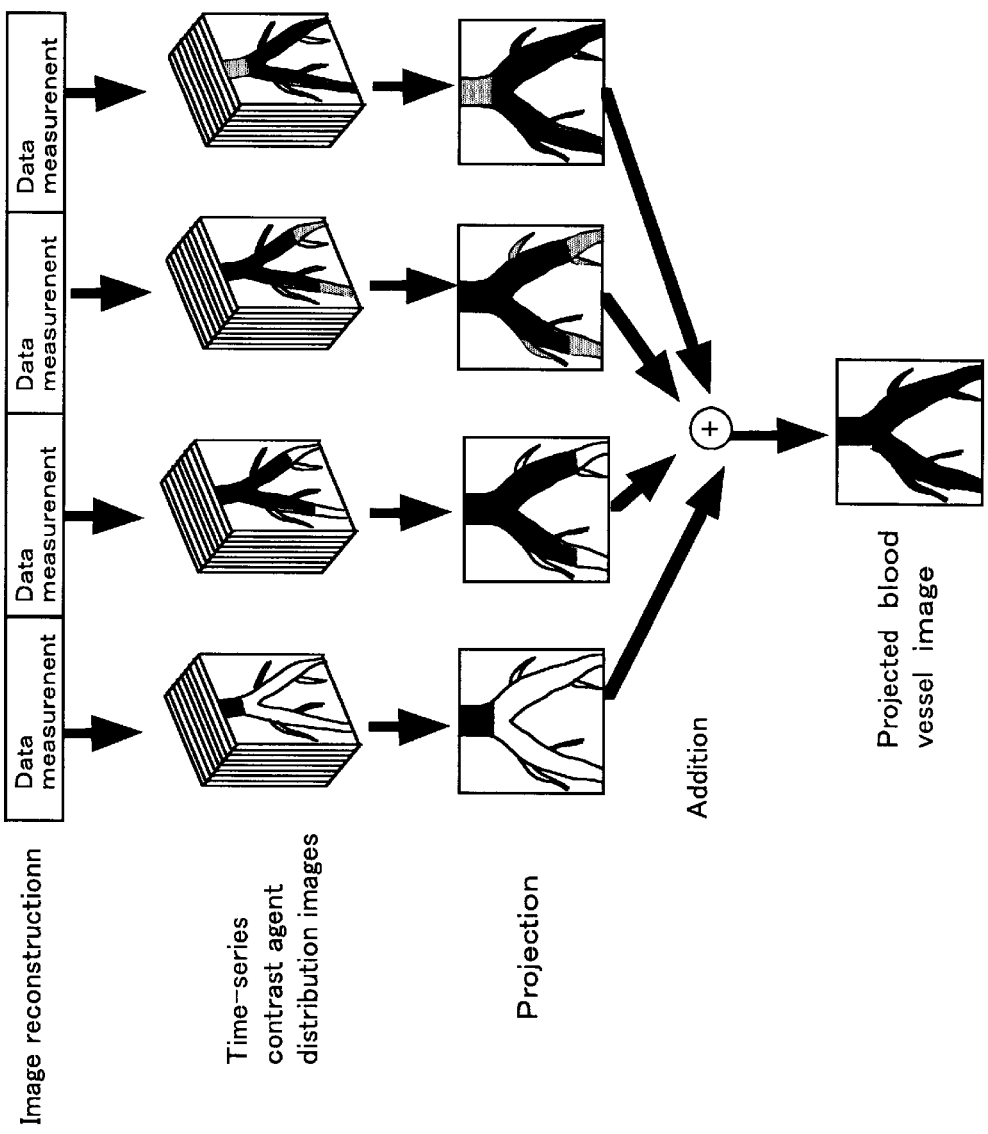
FIG. 13 shows another example of contrast MRA measurement performed in the MRI apparatus according to the present invention.

Although temporal-subtraction and cumulative addition are performed -on image data in the above-exemplified method, the temporal-subtraction may be performed on time-series measurement data. The processing speed can be made higher in subtraction between measurement data before reconstruction than in subtraction of image data. In this case also, a set of pre-administration data (for example, data required for reconstruction of one 3D-image) is used as a standard set and subtraction between the standard data and each of time-series data sets acquired after administration of a contrast agent or at a predetermined time after administration is performed. Then, image reconstruction, cumulative addition, and projection are performed on the difference data. The cumulative addition may be performed before or after the image reconstruction, and before or after the projection. There are three types of methods with different processing orders as shown in FIGS. 11–13. The flow charts of the processes according to these methods are shown in FIGS. 14(a)–14(c).

In an exemplified method of FIG. 11 and FIG. 14(a), image reconstruction using subtraction data, which are obtained by temporal subtraction of 3D-measurement data, is conducted first (step: 601). The temporal subtraction images obtained in this step are contrast agent distribution images because subtraction between pre-administration data and post-administration data is used for reconstruction. The successive steps of obtaining temporal subtraction images by cumulative addition (step: 602) and image processing such as projection of time-integrated images (steps: 603, 604) or volume rendering are performed similarly to the exemplified method of FIG. 10.

In the exemplified method shown in FIG. 12 and FIG. 14(b), subtracted data are subjected to addition (step: 606) first, and then to image reconstruction to produce a time-integrated image. Successive processes are the same as those of the embodiment of FIG. 11 and FIG. 14(a).

In the exemplified method shown in FIG. 13 and FIG. 14(c), 3D-subtraction data is subjected to image reconstruction (step: 601, 2D-projection (step: 607), and then cumulative addition (step: 608) to produce a projected blood image.

The subtraction operation can be performed not only between post-reconstruction image data but also between pre-reconstruction signal data by means of subtraction of complex data. The cumulative addition can be performed for any one of the subtracted data, image data and projected data. The order of processing may be selected taking account of the performance of the CPU 8 and image quality.

Figure 14:
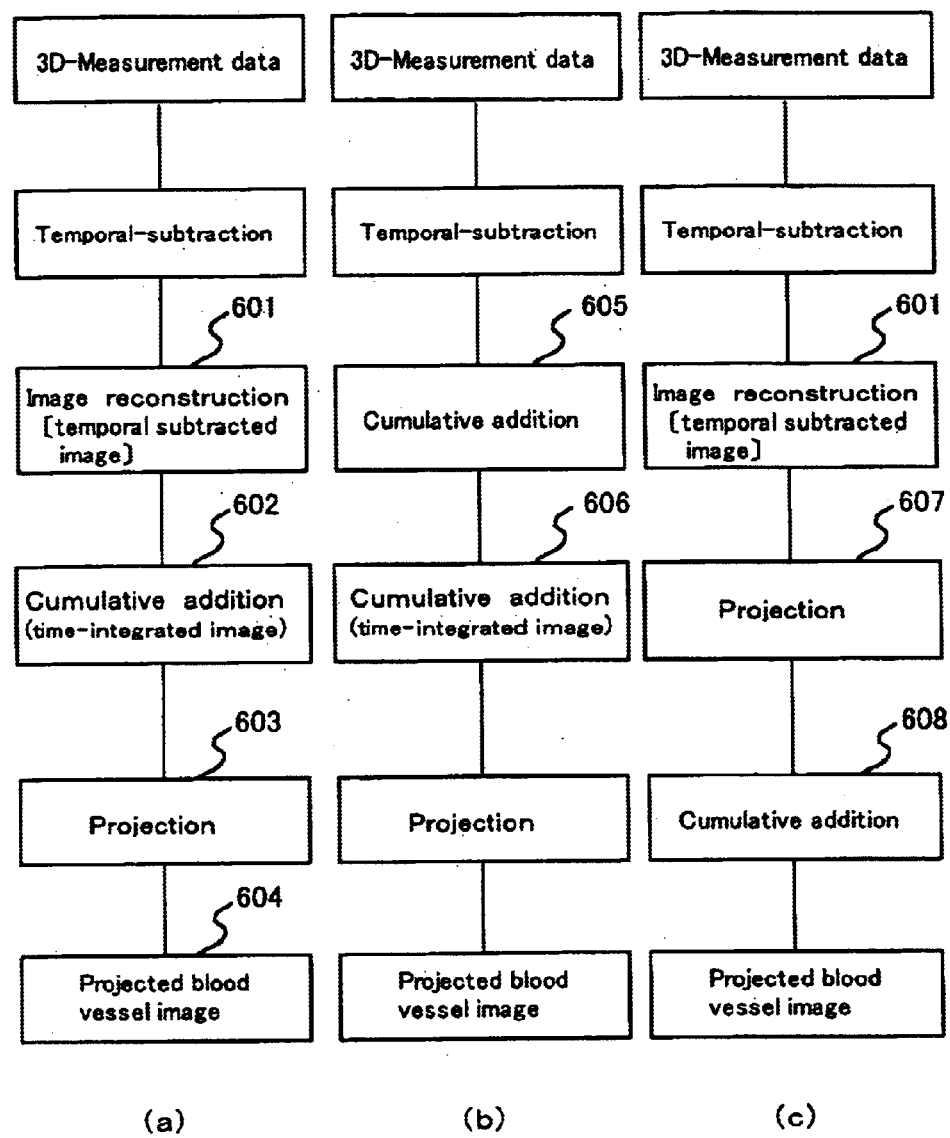
FIG. 14 shows flow charts of processes of contrast MRA measurement shown in FIGS. 11–13.
Figure 15:
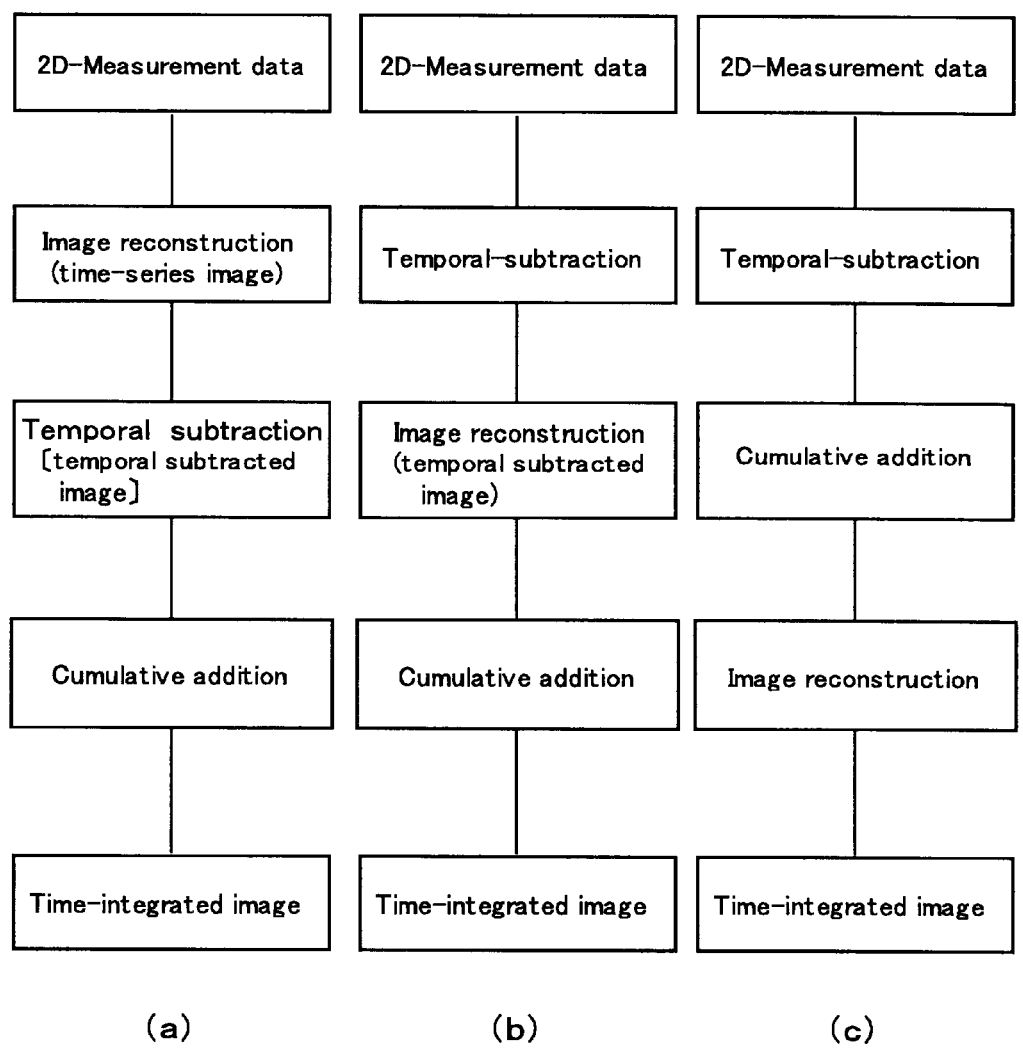
FIG. 15 shows flow charts of the sequence of processing steps of two-dimensional contrast MRA measurement.

Although 3D-measurement data is used in the method of FIG. 14, 2D-measurement data can be processed by similar steps to produce and display a time-integrated image. This is shown in FIG. 15 in the form of a flow chart. Since the only difference between the processes shown in FIG. 15 and those of FIG. 14 is that the data to be processed are two-dimensional data, detailed explanation thereof is omitted.

According to the second embodiment of the present invention, since the signal processing unit of the MRI apparatus has a function of performing temporal subtraction processing and cumulative addition in combination, problems of the conventional contrast MRA, i.e., incomplete imaging of the blood vessel of interest depending on administration timing of contrast agent and circulation speed, or overlapping of veins and arteries, can be prevented and examination under optimum condition can be done for each object to be examined.

What is claimed is:

1. A magnetic resonance imaging method comprising the steps of applying a static magnetic field, gradient magnetic field and RF magnetic field to an object to be examined according to a predetermined pulse sequence, causing nuclear magnetic resonance (NMR) in nuclear spins within a given region of the object, measuring NMR signals caused by the NMR and displaying images produced using the measured signals, wherein a plurality of time-series NMR signal groups are obtained, on an individual image basis, for the same region of the object, one of the obtained NMR signal group is defined as standard data, a plurality of subtracted NMR signal groups are produced by performing subtraction between the standard NMR signal group and each of the other NMR signal groups, the subtracted NMR signal groups are subjected to addition operation, a subtracted NMR signal group obtained by the addition operation is reconstructed and displayed as an image.

2. The magnetic resonance imaging method of claim 1, wherein the subtracted NMR signal groups to be added in the addition operation are weighted using weighting coefficients.

3. The magnetic resonance imaging method of claim 2, wherein the weighting coefficients are determined based on signal intensity of the subtracted NMR signal groups.

4. The magnetic resonance imaging method of claim 2, wherein weighting coefficients having different signs are used in the weighting operation.

5. The magnetic resonance imaging method of claim 2, wherein the weighting coefficients are so determined that arteries and veins are distinguishable.

6. The magnetic resonance imaging method of claim 1, wherein the method further comprises a step of administering a contrast agent to the object and the standard NMR signal group is measured before the contract agent arrives at a predetermined region of the object and the other NMR signal groups are measured while the contrast agent travels within the region.

7. The magnetic resonance imaging method of claim 1, wherein each of the NMR signal groups is capable of producing a two-dimensional image.

8. The magnetic resonance imaging method of claim 1, wherein each of the NMR signal groups is capable of producing a three-dimensional image.

9. The magnetic resonance imaging method of claim 8, wherein the three-dimensional image is projected in the desired direction to produce a two-dimensional image.

10. The magnetic resonance imaging method of claim 1, wherein the subtracted NMR signal groups are subjected to the cumulative addition.

11. The magnetic resonance imaging method of claim 1, wherein the subtraction of the NMR signal groups is performed on the measured complex signals.

12. A magnetic resonance imaging apparatus comprising means for applying a static magnetic field, gradient magnetic field and RF magnetic field by driving magnetic field generating units according to a predetermined pulse sequence, means for detecting NMR signals emitted from an object to be examined by the nuclear magnetic resonance, means for performing image reconstruction operation using the detected NMR signals, and means for displaying the obtained images, wherein the apparatus further comprises means for generating a plurality of time-series NMR signal groups, on an individual image basis, for the same portion within the object by driving and controlling the magnetic field generating units, means for detecting and storing the plurality of NMR signal groups, means for producing a plurality of subtracted NMR signal groups by performing subtraction operation between a standard NMR signal group selected from the plurality of the NMR signal groups and the other NMR signal groups, means for performing addition operation on the plurality of subtracted NMR signal groups, and means for reconstructing an image using the result of the addition operation.

13. The magnetic resonance imaging apparatus of claim 12, wherein said means for performing addition operation performs the cumulative addition on the plurality of subtracted NMR signal groups.

14. The magnetic resonance imaging apparatus of claim 12, wherein the apparatus further comprises means for administering a contrast agent to the object and means for measuring the standard NMR signal group before administration of the contrast agent and measuring the other NMR signal groups successively while the contrast agent travels within the same portion of the object.

15. The magnetic resonance imaging apparatus of claim 12, wherein each of the NMR signal groups is capable of producing a two-dimensional image.

16. The magnetic resonance imaging apparatus of claim 15, wherein said means for performing addition operation performs weighting operation on the plurality of subtracted NMR signal groups using weighting coefficients.

17. The magnetic resonance imaging apparatus of claim 16, wherein weighting coefficients having different signs are used in the weighting operation.

18. The magnetic resonance imaging apparatus of claim 12, wherein each of the NMR signal groups is capable of producing a three-dimensional image.

19. The magnetic resonance imaging apparatus of claim 18, wherein the apparatus further comprises means for performing projection operation on the three-dimensional image.

20. The magnetic resonance imaging apparatus of claim 12, wherein said means for producing a plurality of subtracted NMR signal groups performs the subtraction operation on the measured complex signals.

21. A magnetic resonance imaging method comprising the steps of applying a static magnetic field, gradient magnetic field and RF magnetic field to an object to be examined according to a predetermined pulse sequence, causing nuclear magnetic resonance (NMR) in nuclear spins within a given region of the object, measuring NMR signals caused by the NMR and displaying images produced using the measured signals, wherein a plurality of time-series NMR signal groups are obtained, on an individual image basis, for the same region of the object, one of the obtained NMR signal group is defined as standard data, a plurality of subtracted NMR signal groups are produced by performing subtraction between the standard NMR signal group and each of the other NMR signal groups, the subtracted NMR signal groups are reconstructed to produce images, and the reconstructed images are subjected to addition operation, and an image obtained by the addition operation is displayed.

22. The magnetic resonance imaging method of claim 21, wherein the subtracted NMR signal groups to be added in the addition operation are weighted using weighting coefficients.

23. The magnetic resonance imaging method of claim 22, wherein the weighting coefficients are determined based on signal intensity of the subtracted NMR signal groups.

24. The magnetic resonance imaging method of claim 22, wherein weighting coefficients having different signs are used in the weighting operation.

25. The magnetic resonance imaging method of claim 22, wherein the weighting coefficients are determined so that contrast difference between arteries and veins is enhanced.

26. The magnetic resonance imaging method of claim 21, further comprising a step of administering a contrast agent to the object and the standard NMR signal group is measured before the contract agent arrives at a predetermined region of the object and the other NMR signal groups are measured while the contrast agent travels within the region.

27. The magnetic resonance imaging method of claim 21, wherein each of the NMR signal groups is capable of producing a two-dimensional image.

28. The magnetic resonance imaging method of claim 21, wherein each of the NMR signal groups is capable of producing a three-dimensional image.

29. The magnetic resonance imaging method of claim 28, wherein the reconstructed images are projected in the desired direction to produce two-dimensional images and the two-dimensional images are subjected to addition operation.

30. The magnetic resonance imaging method of claim 28, wherein the reconstructed images are subjected to addition operation to produce a three-dimensional image and the three-dimensional image is projected in the desired direction to produce a tow-dimensional image.

31. The magnetic resonance imaging method of claim 21, wherein the subtracted NMR signal groups are subjected to the cumulative addition.

32. The magnetic resonance imaging method of claim 21, wherein the subtraction of the NMR signal groups is performed on the measured complex signals.

33. A magnetic resonance imaging apparatus comprising means for applying a static magnetic field, gradient magnetic field and RF magnetic field by driving magnetic field generating units according to a predetermined pulse sequence, means for detecting NMR signals emitted from an object to be examined by the nuclear magnetic resonance, means for performing image reconstruction operation using the detected NMR signals, and means for displaying the obtained images, wherein the apparatus further comprises means for generating a plurality of time-series NMR signal groups, on an individual image basis, for the same portion within the object by driving and controlling the magnetic field generating units, means for detecting and storing the plurality NMR signal groups, means for producing a plurality of subtracted NMR signal groups by performing subtraction operation between a standard NMR signal group selected from the plurality of the NMR signals groups and the other NMR signal groups, means for reconstructing images using the subtracted NMR signal groups and means for performing addition operation on the reconstructed images.

34. The magnetic resonance imaging apparatus of claim 33, wherein said means for performing addition operation performs the cumulative addition on the plurality of subtracted NMR signal groups.

35. The magnetic resonance imaging apparatus of claim 33, wherein the apparatus further comprises means for administering a contrast agent to the object and mans for measuring the standard NMR signal group before administration of the contrast agent and measuring the other NMR signal groups successively while the contrast agent travels within the same portion of the object.

36. The magnetic resonance imaging apparatus of claim 33, wherein each of the NMR signal groups is capable of producing a two-dimensional image.

37. The magnetic resonance imaging apparatus of claim 33, wherein each of the NMR signal groups is capable of producing a three-dimensional image.

38. The magnetic resonance imaging apparatus of claim 37, wherein the apparatus further comprises means for performing projection operation on the three-dimensional image before the addition operation.

39. The magnetic resonance imaging apparatus of claim 37, wherein the apparatus further comprises means for performing projection operation on the three-dimensional image after the addition operation.

40. The magnetic resonance imaging apparatus of claim 33, wherein said means for producing a plurality of subtracted NMR signal groups performs the subtraction operation on the measured complex signals.

41. The magnetic resonance imaging apparatus of claim 33, wherein said means for performing addition operation performs weighting operation on the plurality of subtracted NMR signal groups using weighting coefficients.

42. The magnetic resonance imaging apparatus of claim 33, wherein weighting coefficients having different signs are used in the weighting operation.

* * * * *